United States Patent
Schauer et al.

(10) Patent No.: US 7,659,207 B2
(45) Date of Patent: Feb. 9, 2010

(54) EPITAXIALLY COATED SILICON WAFER AND METHOD FOR PRODUCING EPITAXIALLY COATED SILICON WAFER

(75) Inventors: Reinhard Schauer, Laufen (DE); Thorsten Schneppensieper, Emmerting (DE)

(73) Assignee: Siltronic AG, Munich (DE)

( * ) Notice: Subject to any disclaimer, the term of this patent is extended or adjusted under 35 U.S.C. 154(b) by 301 days.

(21) Appl. No.: 11/517,620

(22) Filed: Sep. 8, 2006

(65) Prior Publication Data

US 2007/0066082 A1 Mar. 22, 2007

(30) Foreign Application Priority Data

Sep. 22, 2005 (DE) .................. 10 2005 045 337

(51) Int. Cl.
*H01L 21/311* (2006.01)
(52) U.S. Cl. .................. 438/695; 438/959; 257/629; 257/E21.304; 257/E21.23; 257/E21.579
(58) Field of Classification Search .................. 438/347, 438/646, 692, 695, 959, 963, 974; 257/629, 257/E21.304, E21.23, E21.579
See application file for complete search history.

(56) References Cited

U.S. PATENT DOCUMENTS

| | | | |
|---|---|---|---|
| 5,035,087 A | 7/1991 | Nishiguchi et al. |
| 5,333,413 A | 8/1994 | Hashimoto et al. |
| 5,400,548 A | 3/1995 | Huber et al. |
| 5,584,936 A | 12/1996 | Pickering et al. |
| 6,277,715 B1 | 8/2001 | Takeno et al. |
| 6,478,883 B1 | 11/2002 | Tamatsuka et al. |
| 6,630,024 B2 | 10/2003 | Schmolke et al. |
| 6,670,677 B2 | 12/2003 | Choe et al. |
| 6,899,762 B2 | 5/2005 | Wenski et al. |
| 2001/0032581 A1 | 10/2001 | Wilson et al. |
| 2001/0039917 A1 | 11/2001 | Arai et al. |
| 2003/0068502 A1 | 4/2003 | Togashi et al. |
| 2003/0104222 A1 | 6/2003 | Ono et al. |
| 2003/0175532 A1 | 9/2003 | Asayama et al. |
| 2004/0005777 A1 | 1/2004 | Qu et al. |

(Continued)

FOREIGN PATENT DOCUMENTS

DE 19833257 C1 9/1999

(Continued)

OTHER PUBLICATIONS

English Abstract corresponding to JP 2003309707 A.

(Continued)

*Primary Examiner*—Quoc D Hoang
(74) *Attorney, Agent, or Firm*—Brooks Kushman P.C.

(57) ABSTRACT

Epitaxially coated silicon wafers, are coated individually in an epitaxy reactor by placing a wafer on a susceptor, pretreating under a hydrogen atmosphere, in and then with addition of an etching medium, and coating epitaxially on a polished front side, wherein an etching treatment of the susceptor is effected after a specific number of epitaxial coatings, and the susceptor is then hydrophilized. Silicon wafer produced thereby have a maximum local flatness value $SFQR_{max}$ of 0.01 µm to 0.035 µm relative to at least 99% of the partial regions of an area grid of measurement windows having a size of 26×8 mm² on the front side of the silicon wafer with an edge exclusion of 2 mm.

19 Claims, 7 Drawing Sheets

U.S. PATENT DOCUMENTS

| | | |
|---|---|---|
| 2004/0065250 A1 | 4/2004 | Komiya et al. |
| 2004/0089225 A1 | 5/2004 | Ono et al. |
| 2004/0115941 A1 | 6/2004 | Siebert et al. |
| 2004/0135208 A1* | 7/2004 | Tanahashi et al. ........... 257/368 |
| 2004/0241992 A1 | 12/2004 | Kono et al. |
| 2005/0087830 A1 | 4/2005 | Takeno |
| 2005/0160971 A1 | 7/2005 | Otsuka |
| 2006/0201413 A1 | 9/2006 | Nishizawa |

FOREIGN PATENT DOCUMENTS

| | | |
|---|---|---|
| DE | 19938340 C1 | 2/2001 |
| DE | 10025871 A1 | 12/2001 |
| EP | 272531 A1 | 6/1988 |
| EP | 547894 A1 | 6/1993 |
| EP | 580162 A1 | 1/1994 |
| JP | 2003 163216 A | 6/2003 |
| JP | 2003 309707 A | 10/2003 |
| JP | 2003 318109 A | 11/2003 |
| JP | 2004 175658 A | 6/2004 |
| JP | 165489 A | 6/2004 |
| JP | 2004 335528 A | 11/2004 |
| JP | 2004 356416 A | 12/2004 |
| JP | 2005 011880 A | 1/2005 |
| JP | 2005 39111 A | 2/2005 |
| JP | 2005 197278 A | 7/2005 |
| TW | 1227286 | 8/1988 |
| TW | 1228549 | 3/2005 |
| WO | WO 03/044845 A1 | 5/2003 |
| WO | WO 2005/001916 A1 | 1/2005 |

OTHER PUBLICATIONS

English Abstract corresponding to JP 2003318109 A.
English Abstract corresponding to JP 2003163216 A.
English Abstract corresponding to JP 2004335528 A.
English Abstract corresponding to JP 2004356416 A.
English Abstract corresponding to JP 2005039111 A.
English Abstract corresponding to JP 2005197278 A.
English Abstract corresponding to JP 2005011880 A.
English Abstract corresponding to JP 2004165489 A.
English Abstract corresponding to WO 03/044845 A1.
U.S. Publication No. 2004/0089225A1 is the English equivalent to JP 2004175658 A.
U.S. Patent No. 6,478,883 B1 is the English equivalent to TW 1227286.
U.S. Publication No. 2001/0032581 A1 is the English equivalent to TW 1228549.
English Derwent Abstract AN1999-519699 corresponding to DE19833257.
International Technology Roadmap For Semiconductors, 2005 Edition, "Front End Processes".

* cited by examiner

EPITAXIALLY COATED SILICON WAFER AND METHOD FOR PRODUCING EPITAXIALLY COATED SILICON WAFER

BACKGROUND OF THE INVENTION

1. Field of the Invention

The invention relates to an epitaxially coated silicon wafer and to a method for producing epitaxially coated silicon wafers.

2. Background Art

Epitaxially coated silicon wafers are suitable for use in the semiconductor industry, in particular for the fabrication of large scale integrated electronic components such as microprocessors or memory chips. In this case, stringent requirements are made of the flatness of the front sides of the silicon wafers on which the electronic components are produced. This is necessary in order to avoid problems during exposure of the silicon wafers (lithography) and in intermediate polishing processes ("Chemical Mechanical Polishing", CMP) during fabrication of the components.

A critical property in this case is the local flatness or local geometry of the silicon wafer on its front side. Modern stepper technology requires optimum local planarities in partial regions of the front side of the silicon wafer, expressed for example as SFQR "site front-surface referenced least squares/range" which is magnitude of the positive and negative deviation from a front side defined by minimizing the square error for a component area (measurement window, "site") of defined size. The maximum local flatness value $SFQR_{max}$ specifies the maximum SFQR value for the component areas taken into account on a silicon wafer.

The maximum local flatness value is usually determined taking account of an edge exclusion of 3 mm, by way of example. An area on a silicon wafer within a nominal edge exclusion is usually referred to as "Fixed Quality Area", or to FQA. Those sites which have part of their area lying outside the FQA, but the center of which lies within the FQA, are called "partial sites". The determination of the maximum local flatness often does not involve using the "partial sites", but rather only the so-called "full sites", that is to say the component areas lying completely within the FQA. In order to be able to compare maximum local flatness values, it is essential to specify the edge exclusion and thus the size of the FQA and furthermore to specify whether or not the "partial sites" have been taken into account.

A generally recognized rule of thumb states that the $SFQR_{max}$ value of a silicon wafer must be less than or equal to the possible line width of semiconductor components that are to be produced on the silicon wafer. If this value is exceeded, the stepper experiences focusing problems and the component in question is thus lost. With regard to optimizing costs, however, it is customary nowadays not to reject a silicon wafer owing, for example, only to a component area that exceeds the $SFQR_{max}$ value specified by the component manufacturer, but rather to permit a defined percentage, usually 1%, of component areas with higher values. The percentage of the sites which are permitted to lie below a specific limit value of a geometry parameter is usually specified by a PUA ("Percent Useable Area") value, which, e.g. in the case of an $SFQR_{max}$ of less than or equal to 0.1 μm and a PUA value of 99%, means that 99% of the sites have an $SFQR_{max}$ of less than or equal to 0.1 μm, while higher SFQR values are permitted for 1% of the sites ("chip yield").

According to the prior art, a silicon wafer can be produced by a process sequence of separating a single crystal of silicon into wafers, rounding the mechanically sensitive edges, carrying out an abrasive step such as grinding or lapping followed by a polishing. EP 547894 A1 describes a lapping method; grinding methods are disclosed in published applications EP 272531 A1 and EP 580162 A1.

The final flatness is generally produced by the polishing process, which may be preceded, if appropriate, by an etching step for removing disturbed crystal layers and for removing impurities. A suitable etching method is known from DE 19833257 C1, by way of example. Because traditional single-side polishing methods generally lead to poorer plane-parallelism, polishing methods acting on both sides ("double-side polishing") have been developed which make it possible to produce silicon wafers with improved flatness. In the case of polished silicon wafers, therefore, the required flatness is achieved by mechanical and chemo-mechanical processing steps such as grinding, lapping and polishing.

DE 19938340 C1 describes providing monocrystalline silicon wafers with a layer grown in monocrystalline fashion and made of silicon with the same crystal orientation, a so-called epitaxial coating, on which semiconductor components are later fabricated. Epitaxially coated silicon wafers of this type have certain advantages over silicon wafers made of homogeneous material, for example preventing charge reversal in bipolar CMOS circuits followed by short circuiting of the component ("latch-up"), lower defect densities (for example a reduced number of COPs ("crystal-originated particles"), and also the absence of an appreciable oxygen content, whereby it is possible to preclude a short-circuit risk due to oxygen precipitates in component-relevant regions.

According to the prior art, epitaxially coated silicon wafers are produced from suitable intermediates usually by means of a process sequence of removal polishing—final polishing—cleaning—epitaxy.

DE 10025871 A1 discloses a method for producing a silicon wafer with an epitaxial layer deposited on the front side, this method comprising the following process steps:

(a) a removal polishing as sole polishing step;
(b) hydrophilic cleaning and drying of the silicon wafer;
(c) pretreatment of the front side of the silicon wafer at a temperature of 950 to 1250 degrees Celsius in an epitaxy reactor; and
(d) deposition of an epitaxial layer on the front side of the pretreated silicon wafer.

It is customary, in order to protect silicon wafers from particle loading, to subject the silicon wafers to a hydrophilic cleaning after polishing. The hydrophilic cleaning produces a native oxide on the silicon wafers which is very thin, for example approximately 0.5-2 nm in thickness, depending on the type of cleaning and measurement. The native oxide is later removed later in the course of a pretreatment of the silicon wafer in an epitaxy reactor, usually under a hydrogen atmosphere (also called "$H_2$-Bake").

In a second step, the surface roughness of the front side of the silicon wafer is reduced and polishing defects are removed from the surface by the silicon wafer being pretreated with an etching medium. Gaseous hydrogen chloride (HCl) is usually used as the etching medium and added to the hydrogen atmosphere ("HCl etchant").

The silicon wafer that has been pretreated in this way subsequently acquires an epitaxial layer. Epitaxy reactors, which are used in particular in the semiconductor industry for the deposition of an epitaxial layer on a silicon wafer, are described in the prior art. For this purpose, in the epitaxy reactor, one or more silicon wafers are heated by means of heating sources, preferably by means of upper and lower heating sources, for example lamps or lamp banks, and subsequently exposed to a gas mixture, comprising a source gas comprising a silicon compound (silanes), a carrier gas for example hydrogen and, if appropriate, a doping gas, for example diborane.

The epitaxial layer is usually deposited according to the CVD method ("chemical vapor deposition") by a procedure in which silanes, for example trichlorosilane ($SiHCl_3$, TCS), are passed as the source gas to the surface of the silicon wafer, decompose there at temperatures of 600 to 1250° C. to form elemental silicon and volatile byproducts, and thus form an epitaxially grown silicon layer on the silicon wafer. The epitaxial layer may be undoped, or may be doped in a targeted manner with boron, phosphorus, arsenic or antimony by means of suitable doping gases, in order to set the conduction type and conductivity.

A susceptor, which comprises graphite, silicon carbide (SiC) or quartz, for example, and which is situated in the deposition chamber of the epitaxy reactor, serves as a support for the silicon wafer during the pretreatment steps and during the epitaxial coating. In this case, the silicon wafer usually rests in milled-out portions of the susceptor in order to ensure a uniform heating and to isolate the rear side of the silicon wafer, on which generally no layer is deposited, from the source gas.

In accordance with the prior art, the process chambers of the epitaxy reactors are designed for one or more silicon wafers. In the case of silicon wafers having relatively large diameters (greater than or equal to 150 mm), single wafer reactors are usually used since the latter are known for their good epitaxial layer thickness regularity. The uniformity of the layer thickness can be established by various measures, for example by altering the gas flows (hydrogen, TCS), by incorporating and adjusting gas inlet devices (injectors), by changing the deposition temperature, or by alterations to the susceptor.

In epitaxy, it is customary, following a number of epitaxial depositions on silicon wafers, to carry out an etching treatment of the susceptor without a substrate, in the course of which the susceptor and also other parts of the process chamber are freed of silicon deposits. This etching treatment, which may be effected using hydrogen chloride (HCl), for example, is often performed after the processing of only a small number of silicon wafers (e.g. after 3-5 epitaxial coatings) in the case of single wafer reactors, and is not carried out until after the processing of a higher number of silicon wafers (e.g. after 10-20 epitaxial coatings) in the case of depositing thin epitaxial layers.

Usually, only an etching treatment using HCl or else an etching treatment using HCl followed by brief coating of the susceptor is carried out. The coating of the susceptor is effected in order that the silicon wafer does not bear directly on the susceptor.

It has been shown that the methods known in the prior art lead to a poor yield, since portions of the epitaxially coated silicon wafers have poor local flatness values, particularly in the edge region. By way of example, if an etching treatment of the susceptor is carried out after four epitaxial depositions in each case, at least one of said epitaxially coated silicon wafers will have significantly poorer local flatness values in the edge region. The maximum local flatness parameter $SFQR_{max}$ is usually in the region of 0.05 µm or higher for these epitaxially coated silicon wafers, for which reason they are unsuitable for the imaging of structures (stepper technology) for the future generation of electronic components having line widths of less than 45 nm.

SUMMARY OF THE INVENTION

Therefore, an object of the invention was to increase the yield of epitaxially coated silicon wafers with good local flatness values, and to provide an epitaxially coated silicon wafer which satisfies the requirements of future generations of technology. These and other objects are achieved by means of a method for epitaxially coating silicon wafers, in which a multiplicity of silicon wafers which are polished at least on their front sides are provided, successively and individually coated in an epitaxy reactor by a procedure in which one of the silicon wafers is placed on a susceptor in the epitaxy reactor, is pretreated under a hydrogen atmosphere in a first step, and with addition of an etching medium to the hydrogen atmosphere in a second step, is subsequently coated epitaxially on its polished front side and is removed from the epitaxy reactor, wherein an etching treatment of the susceptor is effected in each case after a specific number of epitaxial coatings and the susceptor is hydrophilized after said etching treatment.

DETAILED DESCRIPTION OF THE PREFERRED EMBODIMENT(S)

The invention is explained below with reference to FIGS. 1 to 7, FIGS. 1 to 5 schematically showing the geometry of the circular silicon wafers in perspective.

In the inventive method, first a multiplicity of silicon wafers which are polished at least on their front sides are provided. For this purpose, a single crystal produced according to the prior art, preferably by crucible pulling according to the Czochralski method, is separated into a multiplicity of silicon wafers by means of known separation methods, preferably by wire sawing with free ("slurry") or bonded grain (diamond wire).

The wafers are then mechanically processed, for example by sequential single-side grinding (SSG), simultaneous double-side grinding ("double-disk grinding" DDG), or lapping. The edge of the silicon wafer including optionally present mechanical markings such as an orientation notch or an essentially rectilinear flattening of the silicon wafer edge ("flat") is generally processed as well (edge rounding, "edge-notch-grinding"). Chemical treatment steps comprising cleaning and etching steps are additionally provided.

After the grinding, cleaning and etching steps, in accordance with the prior art the surface of the silicon wafers is smoothed by removal polishing. In the case of single-side polishing (SSP), silicon wafers are held during processing on the rear side on a carrier plate by means of cement, by vacuum or by means of adhesion. In the case of double-side polishing (DSP), silicon wafers are inserted loosely into a thin toothed disk and polished on the front and rear side simultaneously in a manner "floating freely" between an upper and a lower polishing plate covered with a polishing cloth.

The silicon wafers provided are polished at least on their front sides. Furthermore, the front sides of the silicon wafers are preferably polished in a haze-free manner, for example using a soft polishing cloth with the aid of an alkaline polishing sol. In order to obtain the desired geometry of the silicon wafers produced up to this step, the material removals are relatively small in this case, preferably 0.05 to 1.5 µm. This step is often referred to as CMP polishing ("chemo-mechanical polishing") in the literature.

After polishing, the silicon wafers are subjected to a hydrophilic cleaning and drying according to the prior art. The cleaning may be performed either as a batch method with simultaneous cleaning of a multiplicity of silicon wafers in baths, by spraying methods, or else as a single wafer process.

In a single wafer reactor, epitaxial layers are subsequently deposited onto the polished front sides of the silicon wafers provided. The silicon wafers provided are preferably wafers made of monocrystalline silicon, SOI ("silicon-on-insulator") wafers, wafers with a strained silicon layer ("strained silicon") or sSOI ("strained silicon-on-insulator") wafers.

Before the epitaxial layer is actually deposited onto the polished front side of a silicon wafer, the silicon wafer is first pretreated in the process chamber under a pure hydrogen atmosphere, preferably in a temperature range of 950 to 1200° C., in order that the native oxide formed after the preceding cleaning step is stripped from the front side of the silicon wafer. In this case, a hydrogen flow rate preferably lies within a range of 1-100 slm (Standard Liter per Minute), and is preferably 30-60 slm.

In a second step, an etching medium is added to the hydrogen atmosphere, and the silicon wafer is treated by means of the etching medium, preferably at a temperature of 950-1200° C. Gaseous hydrogen chloride is preferably used as the etching medium. In this case, the concentration of the gaseous HCl is preferably kept in a range of 5-20% by volume, so that an etching rate of 0.01-0.2 µm/min is achieved.

Preferably, besides gaseous HCl, a silane source, for example silane ($SiH_4$), dichlorosilane ($SiH_2Cl_2$), trichlorosilane (TCS, $SiHCl_3$) or tetrachlorosilane ($SiCl_4$), preferably trichlorosilane, is also added to the hydrogen atmosphere in an amount such that silicon deposition and silicon etching removal are in equilibrium. Both reactions proceed at a sufficiently high reaction rate, however, so that silicon on the surface is mobile and the surface is smoothed and defects are removed on the surface.

After the pretreatment steps, an epitaxial layer is deposited on the polished front side of a silicon wafer. For this purpose, a silane source as source gas is added to hydrogen as carrier gas. The epitaxial layer is deposited at a temperature of 900-1200° C. depending on the silane source used. Trichlorosilane (TCS) is preferably used as the silane source, at a deposition temperature of 1050-1150° C. The thickness of the deposited epitaxial layer is preferably 0.5-5 µm. After a specific number of epitaxial coatings of a silicon wafer, the susceptor is treated with an etching medium, during which treatment there is no substrate situated on the susceptor. The etching treatment is preferably effected after 1-5 epitaxial coatings in the process chamber of the epitaxy reactor. This means, for example, after every third epitaxial coating of a silicon wafer, the epitaxially coated silicon wafer is removed from the susceptor or from the epitaxy reactor and the susceptor is subsequently subjected to an etching treatment. The etching treatment is preferably effected using HCl.

In the inventive method, the susceptor is hydrophilized after the etching treatment. What is achieved by means of this hydrophilization of the susceptor is that the surface of the susceptor is saturated with oxygen, that is to say that the susceptor surface is hydrophilic.

The susceptor is preferably hydrophilized by placing a hydrophilic wafer momentarily onto the susceptor. The hydrophilic wafer is a wafer which comprises a hydrophilic layer at least on one of its sides and which is placed onto the susceptor in such a way that said hydrophilic layer and the susceptor surface come into contact. While the hydrophilic wafer bears on the susceptor, the temperature of the susceptor or in the process chamber is preferably 700-1100° C. The hydrophilic wafer is not coated in this case, and is preferably removed again from the susceptor after 1-30 seconds. A further silicon wafer is then subsequently coated epitaxially.

It is particularly effective and therefore particularly preferred to use a wafer made of silicon as the hydrophilic wafer, the silicon wafer bearing a thermal oxide or LTO ("Low Temperature Oxide") layer. While the LTO wafer bears on the susceptor, the temperature of the susceptor is preferably 700-900° C. The LTO wafer is preferably removed again from the susceptor after 1-10 seconds. It is particularly preferred to carry out the etching treatment of the susceptor after every epitaxial coating.

It has been shown that, in the prior art, the silicon wafer which is epitaxially coated directly after a susceptor etch has particularly poor local flatness values in its edge region. This is due to the fact that significant changes in the local flatness of the silicon wafer can occur in particular at the edge of the silicon wafer as a result of the penetration of hydrogen, etching gas or deposition gas between silicon wafer and susceptor. After the etching treatment, the susceptor surface is saturated with hydrogen. If a silicon wafer is then applied to the susceptor surface saturated with hydrogen, it is possible, during the pretreatment in a hydrogen atmosphere, for the hydrogen to diffuse between susceptor and rear side of the silicon wafer, and far inward in the direction of the center of the silicon wafer, stripping away the native oxide layer there. During the subsequent epitaxial coating of the silicon wafer, silicon can grow at the locations etched away on the rear side, in particular in the edge region of the silicon wafer, which leads to a deterioration of local flatness in the edge region of the silicon wafer and thus also to poor maximum local flatness values. This problem does not occur in the method according to the invention since the susceptor is hydrophilized by placing a hydrophilic wafer onto it.

When using an LTO wafer, part of the oxygen is transferred from the LTO layer to the susceptor, so that after the removal of the LTO wafer, oxygen predominates on the susceptor surface. This has the advantage that during the pretreatment of the next silicon wafer to be epitaxially coated in a hydrogen atmosphere, it becomes more difficult for hydrogen to penetrate between susceptor surface and silicon wafer to be epitaxially coated since the indiffusing hydrogen reacts with oxygen from the susceptor saturated with oxygen. This impedes the removal of native oxide on the rear side of the silicon wafer to be epitaxially coated. Since there is no appreciable etching removal of native oxide from the rear side of the silicon wafer, deposition of silicon at etched-away locations does not occur either. This prevents reduction of the local flatness of a silicon wafer that is epitaxially coated directly after a susceptor etch, and increases the yield of epitaxially coated silicon wafers with defined maximum local flatness values. The hydrophilic wafer or the LTO wafer which is placed onto the susceptor after the etching treatment thereof is preferably used a number of times.

The following process sequence is particularly preferred in the context of the invention:

(a) placement of a silicon wafer which is polished at least on its front side onto the susceptor;

(b) pretreatment of the polished silicon wafer under a hydrogen atmosphere and with addition of HCl to the hydrogen atmosphere;

(c) epitaxial coating of this pretreated silicon wafer;

(d) removal of the epitaxially coated silicon wafer;

(e) etching treatment of the susceptor using HCl;

(f) placement of an LTO wafer onto the susceptor for a specific time;

(g) removal of the LTO wafer;

and then steps (a) to (g) again.

This process sequence provides for carrying out an etching treatment of the susceptor after every epitaxial coating, an LTO wafer being placed onto the susceptor after each etching treatment of the susceptor in order to achieve an excess of oxygen on the surface of the susceptor.

It has been shown that this particularly preferred process sequence in accordance with (a) to (g) is suitable for producing a silicon wafer comprising a front side and a rear side, at least the front side being polished and an epitaxial layer being applied to the front side, characterized by a maximum local flatness value $SFQR_{max}$ of 0.01 µm to 0.035 µm relative to at least 99% of the partial regions of an area grid of measurement windows having a size of 26×8 mm² on the front side of the coated silicon wafer and an edge exclusion of 2 mm.

This is achieved in the particularly preferred process sequence by virtue of the fact that the etching treatment of the susceptor is effected after every epitaxial coating. The susceptor is thus freed of silicon deposits prior to each epitaxial coating. In order to prevent hydrogen from being able to penetrate easily between susceptor and silicon wafer during the pretreatment in accordance with (b), after each etching treatment of the susceptor an LTO wafer is placed onto the susceptor for a specific time and subsequently removed. Firstly, this process sequence has the effect that the silicon wafer to be epitaxially coated bears on a clean susceptor surface freed of any deposits, and thus bears in particularly flat fashion. Secondly, the negative influence of the etching treatment of the susceptor on the local flatness of the epitaxially coated silicon wafer, a phenomenon observed in the prior art but not understood, is prevented by the momentary placement of an LTO wafer after the etching treatment of the susceptor.

The following maximum local flatness values arose in the case of silicon wafers epitaxially coated in accordance with the particularly preferred process sequence: 0.013 µm-0.018 µm-0.024 µm-0.028 µm-0.033 µm. In this case, an area grid of measurement windows having a size of 26×8 mm² on the front side of the epitaxially coated silicon wafer and an edge exclusion of 2 mm are once again taken as a basis.

The epitaxially coated silicon wafer preferably has a maximum local flatness value $SFQR_{max}$ of 0.01 µm to 0.025 µm since it has been shown that the method according to the invention exhibits particularly good results in the case of silicon wafers with a polished front and rear side. This is due to the fact that a gap between the susceptor and the rear side of the silicon wafer held by the susceptor is particularly narrow in this case.

If, in the particularly preferred process sequence in accordance with (a), use is made of a silicon wafer which is CMP-polished on the front side and also polished on the rear side, and furthermore of a susceptor having a polished bearing area, it is possible to produce epitaxially coated silicon wafers with further improved maximum local flatness values $SFQR_{max}$. The front and rear sides of the silicon wafer are preferably polished by means of DSP in this case.

Therefore, a silicon wafer comprising a front side and a rear side, front and rear sides being polished by means of DSP and the front side being CMP-polished and an epitaxial layer being applied at least to its front side, preferably has a maximum local flatness value $SFQR_{max}$ of 0.01-0.02 µm, relative to an edge exclusion of 2 mm. In this case, therefore, front and rear sides of the silicon wafer are polished (removal polishing), the front side of the silicon wafer is furthermore free of haze or CMP-polished and the front side of the silicon wafer is provided with an epitaxial layer.

In the case of an epitaxially coated silicon wafer having a diameter of 300 mm, given an edge exclusion of 2 mm, a total of 336 measurement windows (sites) arise in the form of an area grid of segments having a size of 26 mm×8 mm, 52 of these 336 measurement windows being "partial sites". Preferably, in the context of this invention, the "partial sites" are also taken into account in the determination of the maximum local flatness value, that is to say all the partial regions of an area grid of measurement windows having a size of 26 mm×8 mm on the front side of the silicon wafer.

The PUA value ("chip yield") is at least 99%, in other words, for at least 99% of the measurement windows, the local flatness values are less than or equal to the corresponding maximum local flatness value. A PUA value of 100% is preferably achieved, that is to say that the local flatness values for the individual measurement windows are all less than or equal to the maximum local flatness value.

By virtue of the extremely small maximum local flatness value of less than or equal to 0.02 µm, the silicon wafer according to the invention is already suitable for the fabrication of electronic components having line widths of less than or equal to 0.022 µm, according to ITRS ("International Technology Roadmap For Semiconductors") also referred to as hp22 generation technology. Epitaxially coated silicon wafers having such outstanding local flatness values are not known in the prior art.

The silicon wafer according to the invention is preferably a wafer made of monocrystalline silicon, an SOI ("silicon-on-insulator") wafer, a wafer with a strained silicon layer ("strained silicon") or an sSOI ("strained silicon-on-insulator") wafer, in each case provided with an epitaxial layer at least on its front side.

Comparative Example (Prior Art)

Figure 1:
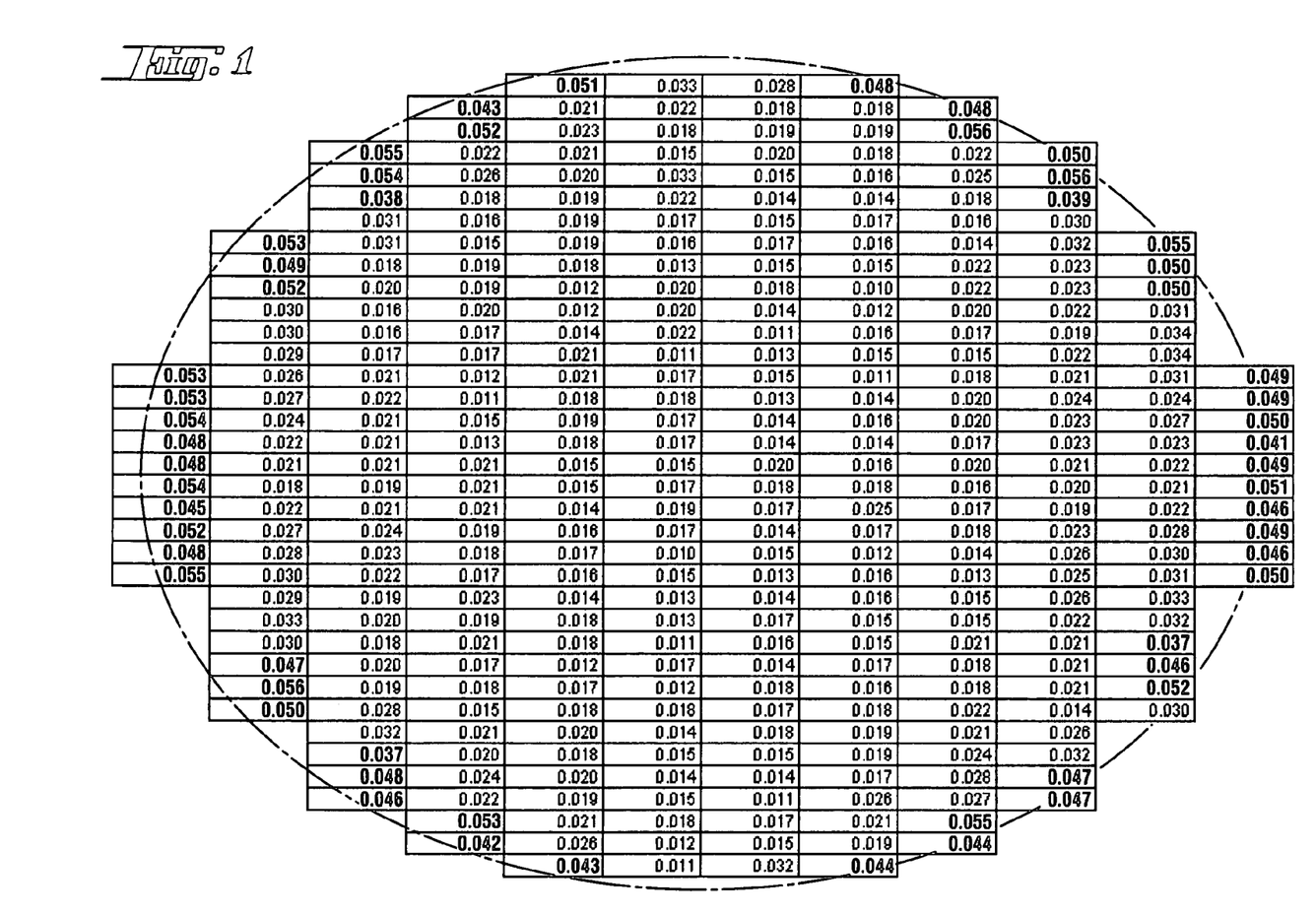
FIG. 1 shows local flatness values for a silicon wafer which is CMP-polished on the front side.

FIG. 1 illustrates local flatness values SFQR of a silicon wafer having a diameter of 300 mm, the silicon wafer being polished on the front and rear sides by means of DSP and being CMP-polished on the front side. The silicon wafer is divided into an area grid of 336 measurement windows having a size of 26×8 mm², of which 52 measurement windows are "partial sites". The determination of the SFQR values is based on an edge exclusion of 2 mm or 296 mm FQA. When the 52 "partial sites" are also taken into account, a maximum local flatness value SFQR$_{max}$ of 0.055 μm results as the maximum of all the SFQR values of this silicon wafer. A great rise in the local flatness values toward the edge is apparent, which is identified by the numerical values being printed in bold.

An epitaxial layer was subsequently deposited on the front side of this CMP-polished silicon wafer in accordance with the prior art. The deposition was effected at a temperature in the process chamber of 1120° C., a TCS flow rate of 17 slm, a flow rate of the carrier gas H$_2$ of 50 slm and a deposition duration of 63 sec.

Figure 2:
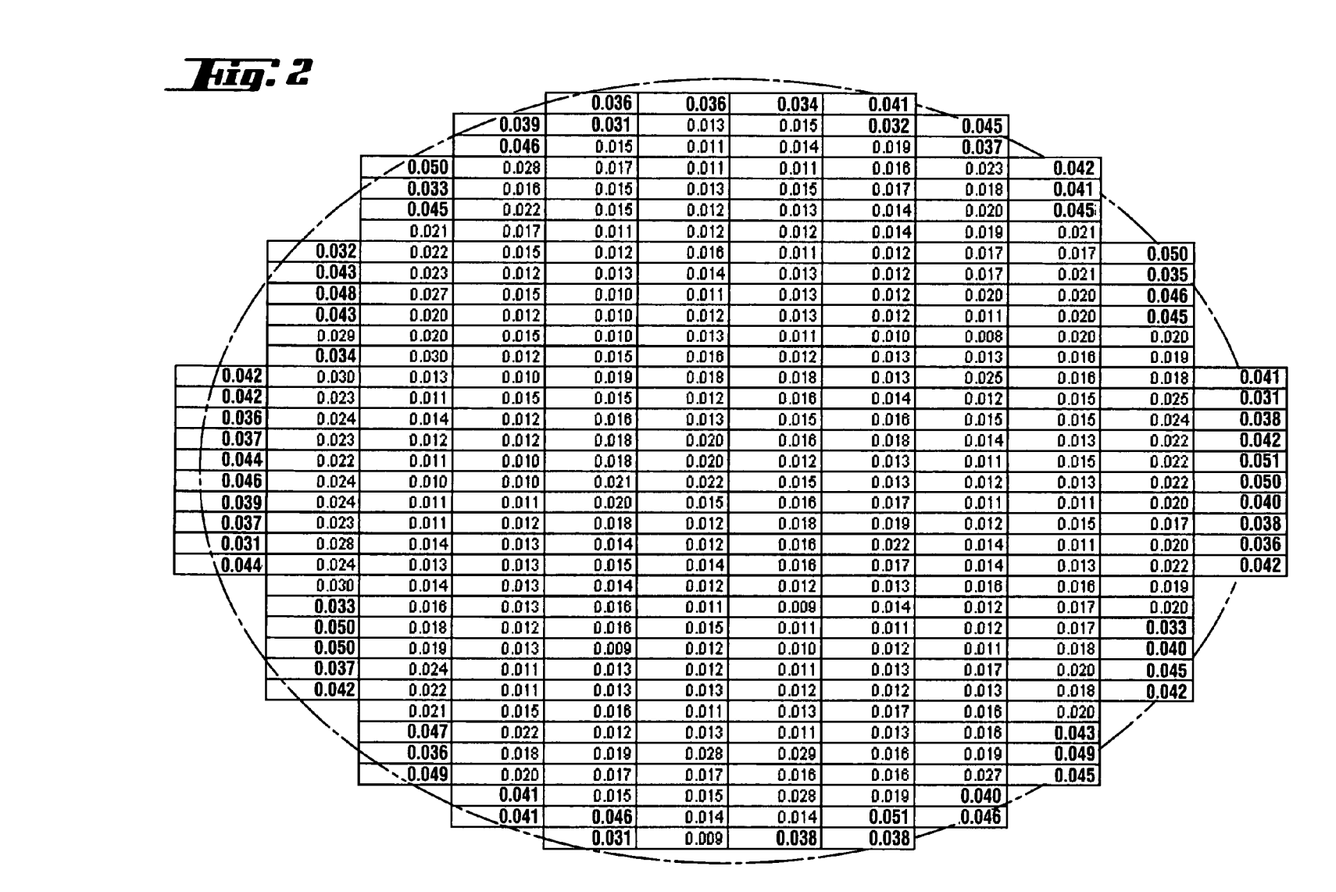
FIG. 2 shows local flatness values for the silicon wafer from FIG. 1 provided with an epitaxial layer according to the prior art.

FIG. 2 illustrates local flatness values for this epitaxially coated silicon wafer. Edge exclusion and FQA correspond to the values mentioned in the description concerning FIG. 1. Here, too, a significant rise in the local flatness values of the epitaxially coated silicon wafer in the edge region is furthermore apparent, which is likewise identified by the numerical values being printed in bold. When the 52 "partial site" are also taken into account, a maximum local flatness value SFQR$_{max}$ of 0.051 μm results.

For further silicon wafers coated epitaxially in accordance with the prior art, that is to say without hydrophilization of the susceptor prior to the epitaxial deposition, the following maximum local flatness values SFQR$_{max}$ arose: 0.042-0.044-0.050-0.057, the latter two values corresponding to the maximum local flatness values of silicon wafers that were coated epitaxially directly after an etching treatment of the susceptor.

EXAMPLE

Figure 3:
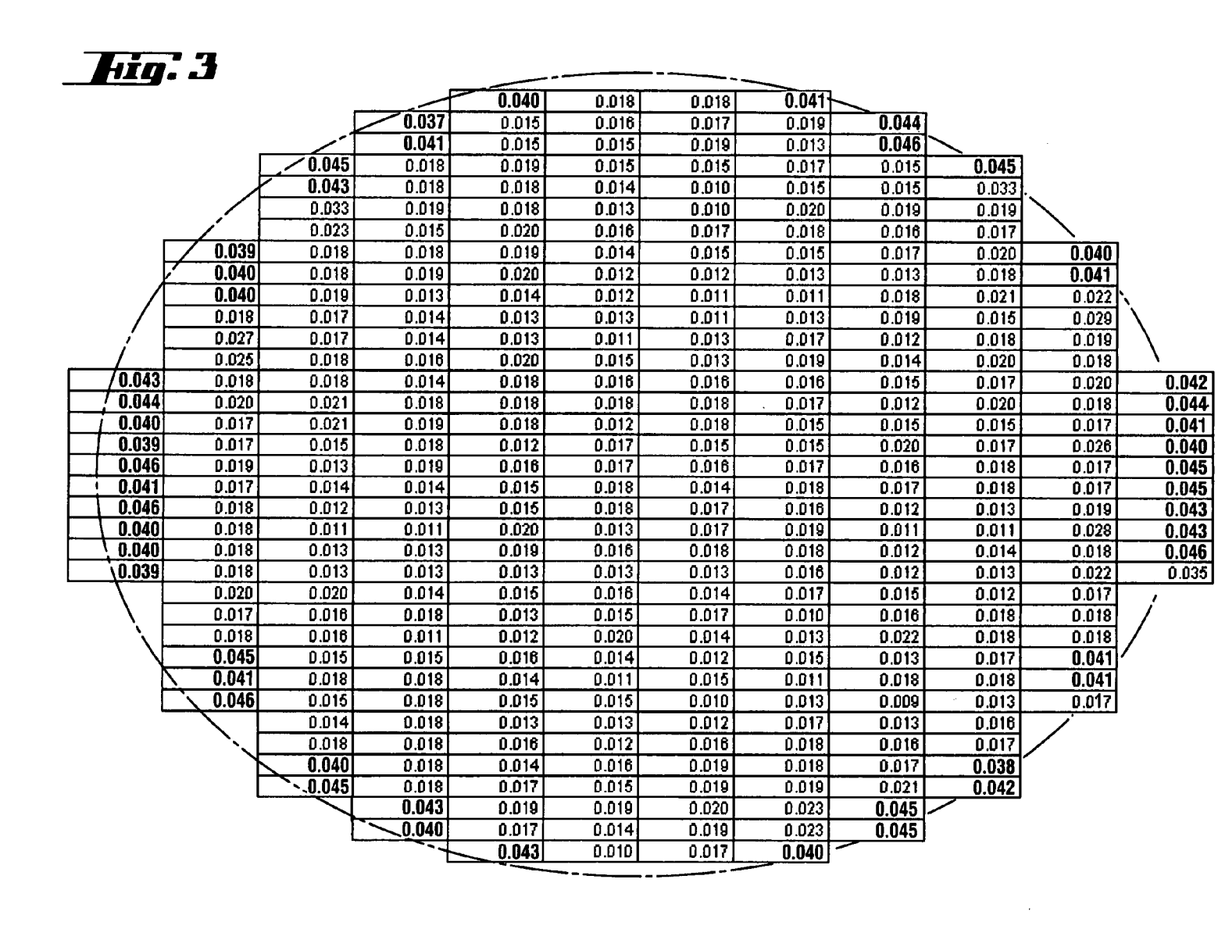
FIG. 3 shows local flatness values for a silicon wafer which is CMP-polished on the front side.

FIG. 3 illustrates local flatness values of a silicon wafer having a diameter of 300 mm, said silicon wafer being polished on front and rear sides by means of DSP and being CMP-polished on the front side, once again with an edge exclusion of 2 mm. Here, too, significantly poorer values with regard to the local flatness are apparent at the edge of the silicon wafer, which is again identified by the numerical values being printed in bold. When the 52 "partial sites" are taken into account, a maximum local flatness value SFQR$_{max}$ of 0.046 μm results.

This CMP-polished silicon wafer was epitaxially coated after an etching treatment of the susceptor and placement of an LTO wafer onto the susceptor. In this case, the LTO wafer was placed onto the susceptor in the process chamber after the etching treatment for 10 sec at a temperature of 900° C. This was followed by an epitaxial deposition on the front side of the CMP-polished silicon wafer, in the course of which the following process parameters were used: TCS flow rate 17 slm, H$_2$ flow rate 50 slm, temperature 1120° C., deposition duration 63 sec.

Figure 4:
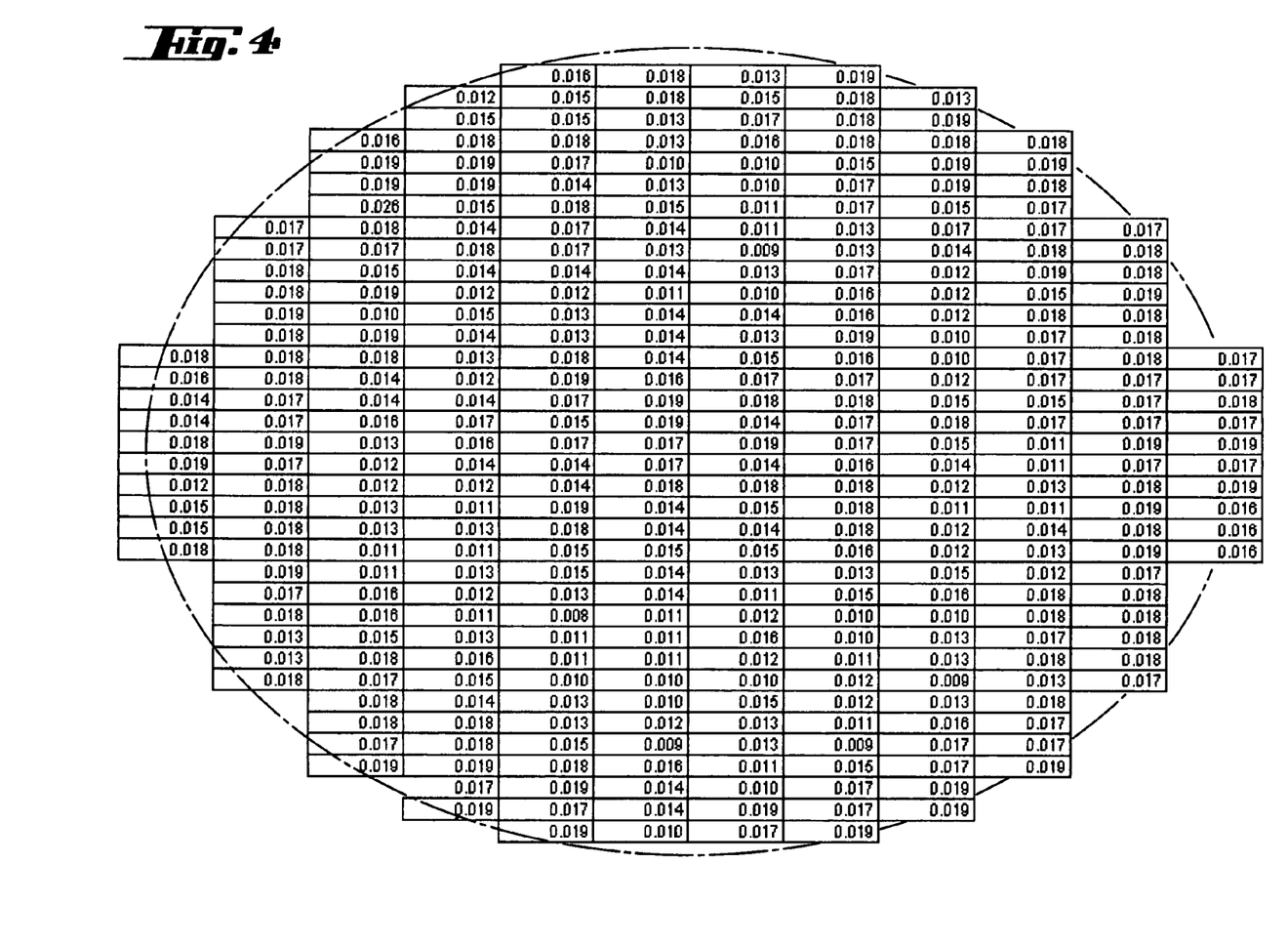
FIG. 4 shows local flatness values for the silicon wafer from FIG. 3 provided with an epitaxial layer in accordance with the invention.

FIG. 4 illustrates local flatness values for this epitaxially coated silicon wafer. A maximum local flatness value SFQR$_{max}$ of 0.019 results in this case. The 52 "partial sites" are taken into account in this case. This outstanding local flatness parameter can be attributed to a significant improvement of the local flatness in the edge region of the epitaxially coated silicon wafer, which is achieved by the method according to the invention, in particular by the susceptor hydrophilization carried out beforehand.

Figure 5:
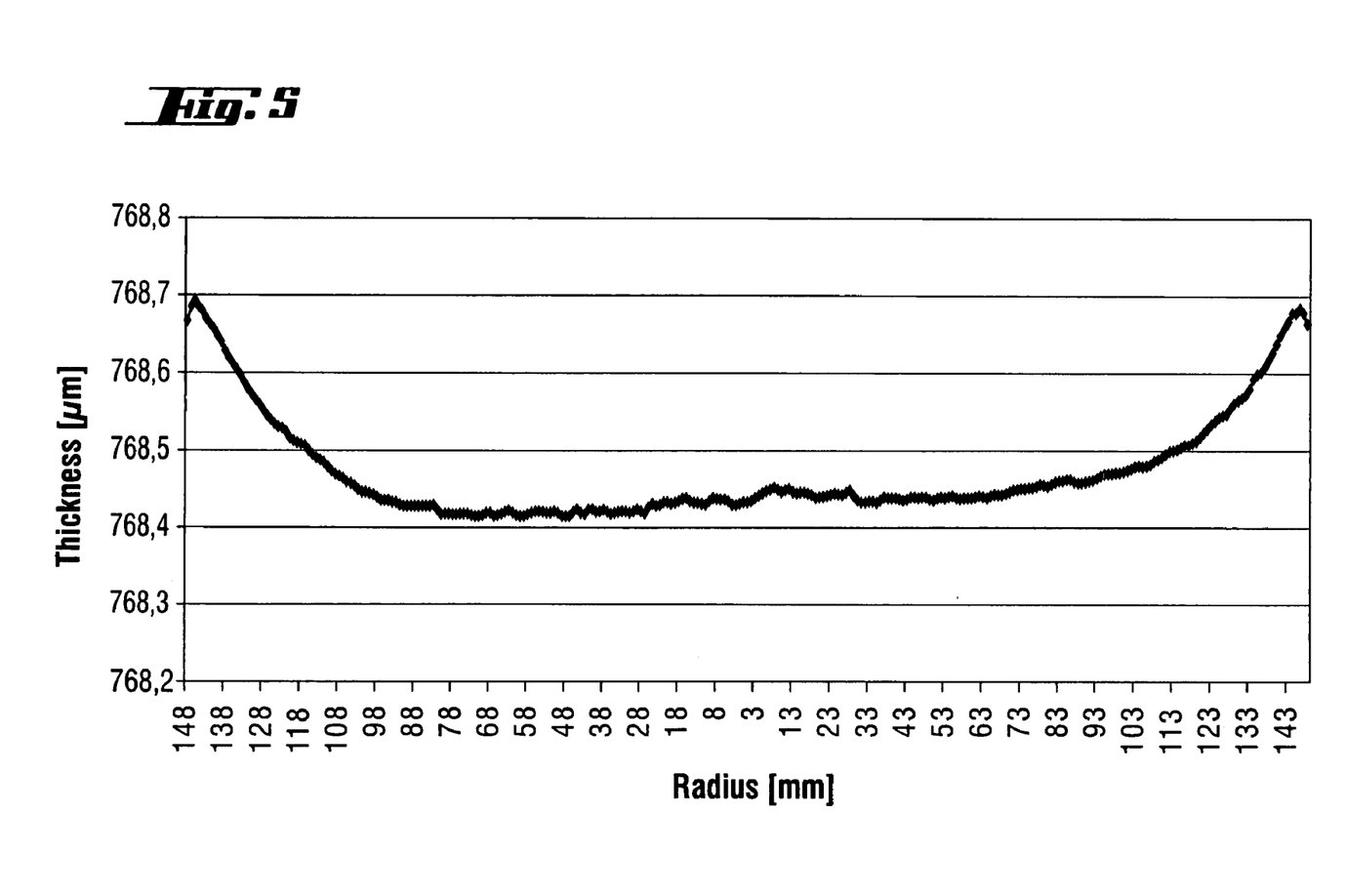
FIG. 5 shows the thickness of a silicon wafer which is CMP-polished on the front side, plotted against the radius of said silicon wafer ("line scan").

FIG. 5 shows the profile of the thickness of a silicon wafer that is CMP-polished on the front side, as a function of the radius of the silicon wafer as a line scan. An edge exclusion of 2 mm is taken as basis. The illustration shows at both edges a significant decrease in the thicknesses of the silicon wafer. This edge decrease can be attributed to the polishing steps. A silicon wafer is usually polished concavely, that is to say that the thickness of the polished silicon wafer increases from the center of the silicon wafer outward to exhibit a decrease in thickness only at the edge ("roll-off").

Figure 6:
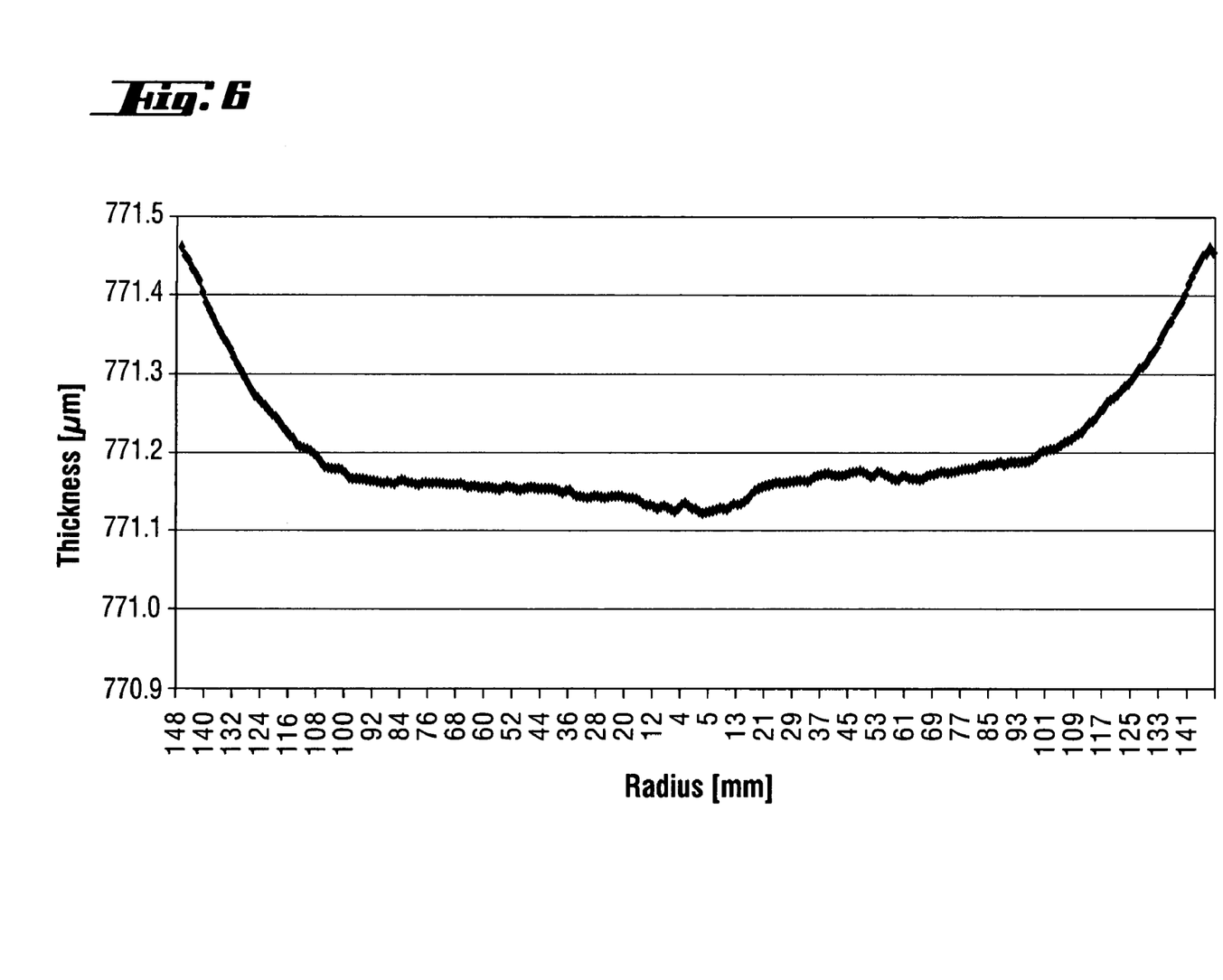
FIG. 6 shows the profile of the thickness of a silicon wafer which is provided with an epitaxial layer in accordance with the invention and has been CMP-polished on the front side beforehand, against the radius of the silicon wafer as a line scan.

FIG. 6 shows the profile of the thickness of the silicon wafer which is CMP-polished on the front side and provided with an epitaxial layer, as a function of the radius of this epitaxially coated silicon wafer as a line scan. The thickness of the epitaxially coated silicon wafer increases from the inner portion outward. An edge decrease with regard to the thickness of the silicon wafer is no longer discernible.

Figure 7:
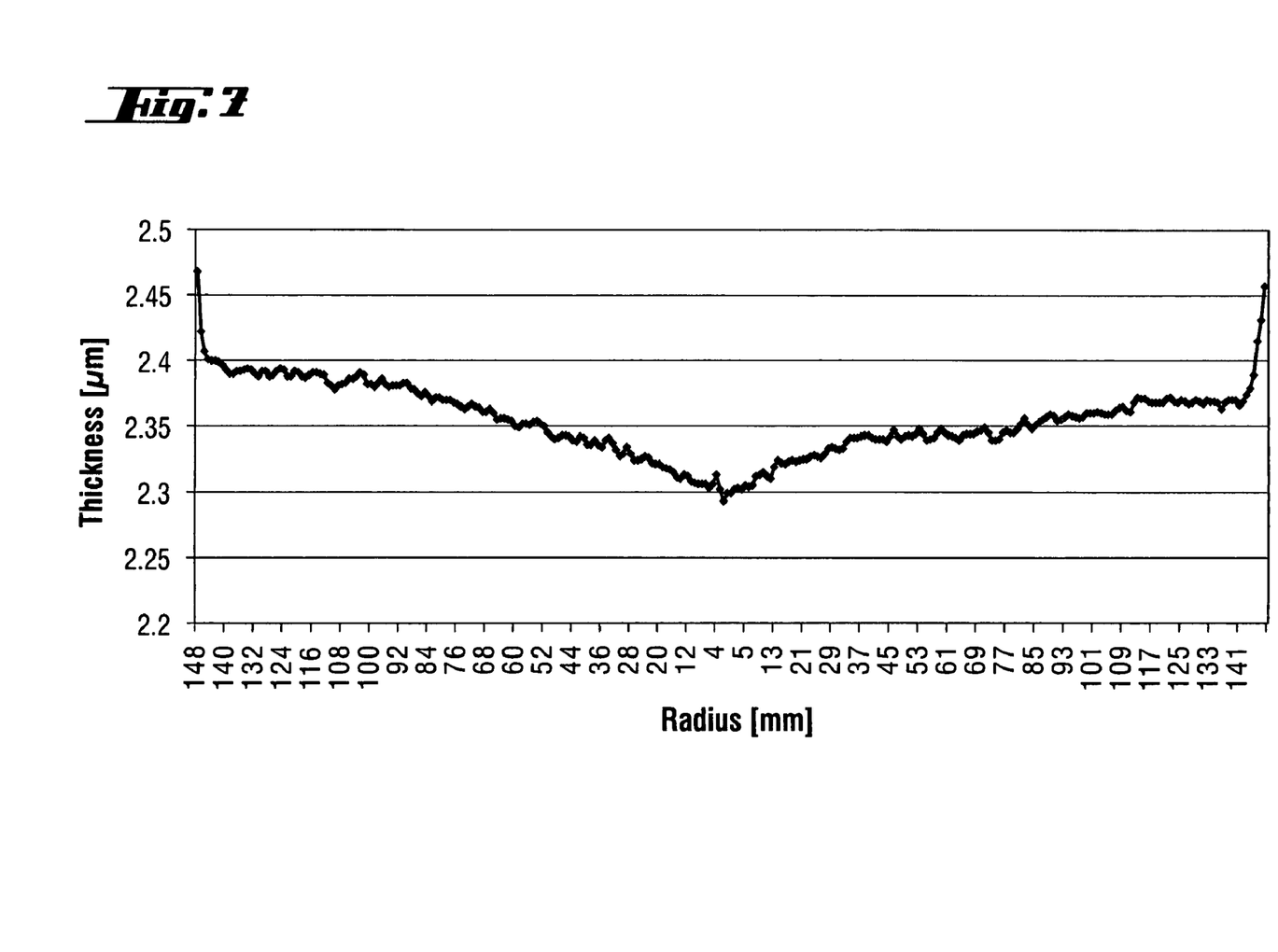
FIG. 7 shows a difference between the thickness of a silicon wafer which is provided with an epitaxial layer in accordance with the invention and has been CMP-polished on the front side beforehand and the thickness of this silicon wafer polished in a haze-free manner on the front side, against its radius (line scan).

Finally, FIG. 7 shows the difference between the thickness of the epitaxially coated silicon wafer from FIG. 6 and the thickness of the CMP-polished silicon wafer from FIG. 5 as a function of the radius of this silicon wafer as a line scan. The illustration thus shows how the thickness of the CMP-polished silicon wafer has changed as a result of the pretreatment steps and the deposition of an epitaxial layer.

It is evident that the thickness of the epitaxially coated silicon wafer has increased significantly at the edge, as a result of which the edge decrease observed in the case of the CMP-polished silicon wafer is at least partly compensated for. This also results in an improvement of the local flatness of the epitaxially coated silicon wafer at the edge and overall in a significant improvement of the maximum local flatness, as has been shown in FIG. 4. This can be attributed to the hydrophilization of the susceptor prior to the epitaxial coating, which impedes hydrogen from penetrating between susceptor and silicon wafer during the pretreatment and native oxide from being removed on the rear side of the silicon wafer, which would have the consequence that silicon would grow at the locations freed of native oxide on the rear side of the silicon wafer, and would lead to still poor local flatness values particularly in the edge region, as set out in the comparative example and in FIG. 2.

In further measurements, epitaxially coated silicon wafers wherein an etching treatment of the susceptor was carried out prior to the epitaxial deposition and an LTO wafer was subsequently placed onto the susceptor for 10 sec at a temperature of 900° C. in the process chamber, exhibited the following maximum local flatness values SFQR$_{max}$:0.012-0.014-0.015-0.018. The examined silicon wafers were polished in each case by means of DSP on front and rear sides and CMP-polished on their front side. Moreover, a susceptor with a polished bearing area was used.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing epitaxially coated silicon wafers, in which a multiplicity of silicon wafers having a front side and a rear side are polished at least on a front side thereof, comprising successively and individually coating said wafers in an epitaxy reactor, wherein one silicon wafer is placed on a susceptor in the epitaxy reactor, is pretreated under a hydrogen atmosphere in a first step, and with addition of an etching medium to the hydrogen in a second step, is subsequently coated epitaxially on its polished front side, and is removed from the epitaxy reactor, wherein an etching treatment of the susceptor is effected after a specific number of epitaxial coatings, and the susceptor is hydrophilized after said etching treatment, wherein the silicon wafers have a front side and a rear side, at least the front sides being polished, and an epitaxial layer applied at least the front sides, the wafers having a maximum local flatness value $SFQR_{max}$ of 0.01 µm to 0.035 µm relative to at least 99% of the partial regions of an area grid of measurement windows having a size of 26×8 mm² on the front sides of the coated silicon wafers, with an edge exclusion of 2 mm, having a maximum local flatness value $SFQR_{max}$ of 0.01 µm to 0.035 µm relative to at least 99% of the partial regions of an area grid of measurement windows having a size of 26×8 mm² on the front side of the coated silicon wafer with an edge exclusion of 2 mm.

2. The method of claim 1, wherein the susceptor is hydrophilized by momentarily placing a hydrophilic wafer onto the susceptor and subsequently removing said wafer from the epitaxy reactor.

3. The method of claim 2, wherein an etching treatment of the susceptor is effected after each epitaxial coating.

4. The method of claim 2, wherein the hydrophilic wafer is placed onto the susceptor for 1-30-seconds at a temperature in the range of 700-1100°C.

5. The method of claim 2, wherein the hydrophilic wafer is a silicon wafer and a hydrophilic layer on the silicon wafer is a thermal oxide layer.

6. The method of claim 5, wherein the thermal oxide layer of silicon wafer is placed onto the susceptor for 1-10 seconds, at a temperature in the range of 700-900°C.

7. The method of claim 2, wherein the hydrophilic wafer is used more than once.

8. The method of claim 1, wherein an etching treatment of the susceptor is effected after each epitaxial coating.

9. The method of claim 1, wherein a silicon layer is deposited on the susceptor after the etching treatment of the susceptor.

10. The method of claim 1, wherein the silicon wafers are polished by means of DSP on the front side and rear side.

11. The method of claim 1, wherein the silicon wafers are polished by means of CMP on their front side.

12. The method of claim 1, wherein a susceptor with a polished bearing area is used.

13. The method of claim 1, wherein the silicon wafers are wafers made of monocrystalline silicon, SOI wafers, wafers having a strained silicon layer, or sSOI wafers.

14. A silicon wafer having a front side and a rear side, at least its front side being polished and an epitaxial layer applied at least its front side, having a maximum local flatness value $SFQR_{max}$ of 0.01 µm to 0.035 µm relative to at least 99% of the partial regions of an area grid of measurement windows having a size of 26×8 mm² on the front side of the coated silicon wafer with an edge exclusion of 2 mm.

15. The silicon wafer of claim 14, comprising polished front and rear sides, a CMP-polished front side and an epitaxial layer on the front side, the front side having a maximum local flatness value $SFQR_{max}$ of 0.01 µm to 0.025 µm.

16. The silicon wafer of claim 15, the front and rear sides thereof polished by DSP.

17. The silicon wafer of claim 14, having a maximum local flatness value $SFQR_{max}$ of 0.01 µm to 0.02 µm, relative to all the partial regions of an area grid of measurement windows having a size of 26×8 mm² on the front side of the coated silicon wafer.

18. The silicon wafer of claim 14, where the silicon wafer, prior to being provided with an epitaxial layer, is selected from the group consisting of wafers made of monocrystalline silicon, SOI wafers, wafers with a strained silicon layer, and a sSOI wafers.

19. The silicon wafer of claim 14, the thickness of the epitaxial layer applied on its front side is 0.5-5 µm in thickness.

* * * * *

UNITED STATES PATENT AND TRADEMARK OFFICE
CERTIFICATE OF CORRECTION

PATENT NO. : 7,659,207 B2 Page 1 of 1
APPLICATION NO. : 11/517620
DATED : February 9, 2010
INVENTOR(S) : Reinhard Schauer et al.

It is certified that error appears in the above-identified patent and that said Letters Patent is hereby corrected as shown below:

Column 11, Line 2, Claim 1:

After "an epitaxial layer applied"

Insert -- to --.

Column 12, Line 10, Claim 14:

After "an epitaxial layer applied"

Insert -- to --.

Signed and Sealed this

Sixth Day of April, 2010

David J. Kappos
*Director of the United States Patent and Trademark Office*